US008018788B2

(12) United States Patent
Jung et al.

(10) Patent No.: US 8,018,788 B2
(45) Date of Patent: Sep. 13, 2011

(54) STATIC MEMORY DEVICE AND STATIC RANDOM ACCESS MEMORY DEVICE

(75) Inventors: Jong-Hoon Jung, Seoul (KR); Soung-Hoon Sim, Yongin-si (KR); Jung-Min Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 100 days.

(21) Appl. No.: 12/382,858

(22) Filed: Mar. 25, 2009

(65) Prior Publication Data

US 2009/0251984 A1 Oct. 8, 2009

(30) Foreign Application Priority Data

Mar. 26, 2008 (KR) .................. 10-2008-0027756

(51) Int. Cl.
*G11C 5/14* (2006.01)
(52) U.S. Cl. .................. 365/226; 365/154; 365/229
(58) Field of Classification Search .................. 365/226, 365/154, 156, 229
See application file for complete search history.

(56) References Cited

U.S. PATENT DOCUMENTS

| 6,603,345 | B2 | 8/2003 | Takahashi |
| 7,190,187 | B2 | 3/2007 | Hua et al. |
| 7,502,275 | B2 * | 3/2009 | Nii et al. ..................... 365/226 |
| 2008/0259699 | A1 | 10/2008 | Van Berkel |
| 2009/0207675 | A1 * | 8/2009 | Kengeri et al. .......... 365/189.14 |

FOREIGN PATENT DOCUMENTS

| KR | 10-2002-0071715 A | 9/2002 |
| KR | 10-0451422 B1 | 9/2004 |
| KR | 10-2007-0058514 A | 6/2007 |

* cited by examiner

*Primary Examiner* — Huan Hoang
(74) *Attorney, Agent, or Firm* — Lee & Morse, P.C.

(57) ABSTRACT

A static memory device includes a bit cell connected to an internal voltage line, and a power supply control circuit connected between the internal voltage line and a power supply voltage, wherein the power supply control circuit is configured to supply the power supply voltage level to the internal voltage line, and the power supply control circuit is configured to perform a write assist function that includes floating the internal voltage line during a write operation on the bit cell, the internal voltage line being floated in response to a signal of a mode control signal group.

12 Claims, 11 Drawing Sheets

STATIC MEMORY DEVICE AND STATIC RANDOM ACCESS MEMORY DEVICE

BACKGROUND

1. Field

Example embodiments relate to a static memory device and a static random access memory device.

2. Description of the Related Art

As the degree of integration of a semiconductor memory device increases, distribution of transistor characteristics, such as doping concentration and oxide thickness, may become widely dispersed, thereby degrading stability of memory cells included in the semiconductor memory device. To improve the transistor characteristics, various semiconductor manufacturing processes may be implemented. However, there is a limit to improving the stability of the memory cells merely by controlling the manufacturing process. Therefore, there is a need to improve the stability of the memory cells through the design of the semiconductor memory device.

Moreover, a semiconductor memory device consuming low power is required in mobile devices. However, when reducing power consumption by varying a power supply voltage, a data retention failure may occur in memory cells because the memory cells commonly share a single power source.

SUMMARY

Embodiments are therefore directed to a static memory device and a static random access memory device, which substantially overcome one or more of the problems due to the limitations and disadvantages of the related art.

It is therefore a feature of an embodiment to provide a static memory device configured to improve write stability of a bit cell while occupying a small circuit area It is therefore another feature of an embodiment to provide a static random access memory (SRAM) device having a write assist function for improving the write stability of a bit cell.

At least one of the above and other features and advantages may be realized by providing a static memory device, including a bit cell connected to an internal voltage line, and a power supply control circuit connected between the internal voltage line and a power supply voltage. The power supply control circuit may be configured to supply the power supply voltage level to the internal voltage line, and the power supply control circuit may be configured to perform a write assist function that includes floating the internal voltage line during a write operation on the bit cell, the internal voltage line being floated in response to a signal of a mode control signal group.

The power supply control circuit may be configured to float the internal voltage line in response to a write assist signal of the mode control signal group, and the power supply control circuit may include a first p-type metal oxide semiconductor (PMOS) transistor including a source connected to the power supply voltage, a drain connected to the internal voltage line, and a gate configured to receive the write assist signal, and a second PMOS transistor including a source connected to the power supply voltage, a gate connected to the internal voltage line, and a drain connected to the internal voltage line.

The static memory device may be configured to perform a read operation on the bit cell while the write assist signal corresponds to a logic state "low", and the static memory device may be configured to perform the write operation on the bit cell while the write assist signal corresponds to a logic state "high".

The power supply control circuit may be configured to float the internal voltage line at the bit cell when the write assist signal corresponds to the logic state "high" during the write operation, and the floated internal voltage line may have a voltage level between a first voltage level corresponding to the power supply voltage and a second voltage level that is less than the power supply voltage by an amount equal to a threshold voltage level of the second PMOS transistor.

The mode control signal group may include a write assist signal and a sleep mode signal, and the power supply control circuit may include a NAND gate configured to receive the write assist signal and the sleep mode signal, a first PMOS transistor including a source connected to the power supply voltage, a drain connected to the internal voltage line, and a gate configured to receive an output signal from the NAND gate, and a second PMOS transistor including a source connected to the power supply voltage, a gate connected to the internal voltage line, and a drain connected to the internal voltage line.

The power supply control circuit may be configured to float the internal voltage line at the bit cell when the sleep mode signal corresponds to a logic state "high" and the write assist signal corresponds to a logic state "low" during the write operation, and the floated internal voltage line may have a voltage level between a first voltage level corresponding to the power supply voltage and a second voltage level that is less than the power supply voltage by an amount equal to a threshold voltage level of the second PMOS transistor.

The mode control signal group may include a write assist signal and a power down signal, and the power supply control circuit may include a first PMOS transistor including a source connected to the power supply voltage, a drain connected to the internal voltage line, and a gate configured to receive the write assist signal, a second PMOS transistor including a source connected to the power supply voltage, and a gate configured to receive the power down signal, and a third PMOS transistor including a source connected to a drain of the second PMOS transistor, a gate connected to the internal voltage line, and a drain connected to the internal voltage line.

The power supply control circuit may be configured to float the internal voltage line at the bit cell when the power down signal corresponds to a logic state "low" and the write assist signal corresponds to a logic state "high" during the write operation, and the voltage on the floated internal voltage line may have a voltage level between a first voltage level corresponding to the power supply voltage and a second voltage level that is less than the power supply voltage by an amount equal to a threshold voltage level of the third PMOS transistor.

The bit cell may operate in a power down mode when the power down signal corresponds to a logic state "high".

The mode control signal group may include a write assist signal, a sleep mode signal, and a power down signal, and the power supply control circuit may include a NAND gate configured to receive the sleep mode signal and the write assist signal, a first PMOS transistor including a source connected to the power supply voltage, a drain connected to the internal voltage line, and a gate configured to receive an output signal from the NAND gate, a second PMOS transistor including a source connected to the power supply voltage, and a gate configured to receive the power down signal, and a third PMOS transistor including a source connected to a drain of the second PMOS transistor, a gate connected to the internal voltage line, and a drain connected to the internal voltage line.

The power supply control circuit may be configured to float the internal voltage line at the bit cell when the power down signal corresponds to a logic state "low", the sleep mode signal corresponds to a logic state "high", and the write assist signal corresponds to a logic state "low" during the write operation, and the floated internal voltage may have a voltage level between a first voltage level corresponding to the power supply voltage and a second voltage level that is less than the power supply voltage by an amount equal to a threshold voltage level of the third PMOS transistor.

The bit cell may operate in a power down mode when the power down signal corresponds to a logic state "high" and the sleep mode signal corresponds to the logic state "high".

The mode control signal group may include a write assist signal and a power down signal, and the power supply control circuit may include a PMOS transistor including a source connected to the power supply voltage, a drain connected to the internal voltage line, and a gate configured to receive the write assist signal, and an n-type metal oxide semiconductor (NMOS) transistor including a drain connected to the power supply voltage, a gate configured to receive the power down signal, and a source connected to the internal voltage line.

The power supply control circuit may be configured to float the internal voltage line at the bit cell when the power down signal corresponds to a logic state "high" and the write assist signal corresponds to the logic state "high" during the write operation, and the floated internal voltage line may have a voltage level between a first voltage level corresponding to the power supply voltage and a second voltage level that is less than the power supply voltage by an amount equal to a threshold voltage level of the NMOS transistor.

The mode control signal group may include a write assist signal, a sleep mode signal, and a power down signal, and the power supply control circuit may include a NAND gate configured to receive the sleep mode signal and the write assist signal, a PMOS transistor including a source connected to the power supply voltage, a drain connected to the internal voltage line, and a gate configured to receive an output signal from the NAND gate, and an NMOS transistor including a drain connected to the power supply voltage, a gate configured to receive the power down signal, and a source connected to the internal voltage line.

The power supply control circuit may be configured to float the internal voltage line at the bit cell when the power down signal corresponds to a logic state "high", the sleep mode signal corresponds to the logic state "high", and the write assist signal corresponds to the logic state "low" during the write operation, and the voltage on the floated internal voltage line may have a voltage level between a first voltage level corresponding to the power supply voltage and a second voltage level that is less than the power supply voltage by an amount equal to a threshold voltage level of the NMOS transistor.

At least one of the above and other features and advantages may also be realized by providing a static random access memory (SRAM) device, including a plurality of word lines, a plurality of bit line pairs, a plurality of bit cells, each bit cell being connected to an internal voltage line, a word line, and a bit line pair, the plurality of bit cells including rows and columns for storing data, and at least one power supply control circuit connected between a power supply voltage and the internal voltage line. The power supply control circuit may be configured to supply the power supply voltage level to the internal voltage line, and the power supply control circuit may be configured to perform a write assist function that includes floating the internal voltage line during a write operation on the bit cell, the internal voltage line being floated in response to a signal of a mode control signal group.

The mode control signal group may include a write assist signal, and the SRAM device may be configured to perform the write operation on the bit cells while the write assist signal corresponds to a logic state "high".

When the write operation is performed on the bit cells, the internal voltage line may be floated and a voltage on the floated internal voltage line may be supplied to the bit cells. The voltage on the floated internal voltage line may have a voltage level between a first voltage level corresponding to the power supply voltage and a second voltage level that is less than the power supply voltage by an amount equal to a threshold voltage of a transistor in the power supply control circuit.

Each of the bit cells may include a first access transistor including a gate connected to a word line of the plurality of word lines and a first terminal connected to a first bit line of a corresponding bit line pair of the plurality of bit line pairs, a second access transistor including a gate connected to the word line and a first terminal connected to a second bit line of the corresponding bit line pair, and a latch circuit connected between the internal voltage line and a ground voltage, and connected between second terminals of the first access transistor and the second access transistor.

At least one of the above and other features and advantages may also be realized by providing a static random access memory system, including a memory cell array including a plurality of bit cells, driving circuits including row and address decoders that operate bit cells of the memory cell array, a sense amp outputting logic level signals from the memory cell array, and at least one power supply control circuit connected between a power supply voltage and an internal voltage line providing power to a bit cell of the plurality of bit cells. The power supply control circuit may be configured to supply the power supply voltage level to the internal voltage line, and the power supply control circuit may be configured to perform a write assist function that includes floating the internal voltage line during a write operation on the bit cell, the internal voltage line being floated in response to a signal of a mode control signal group.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
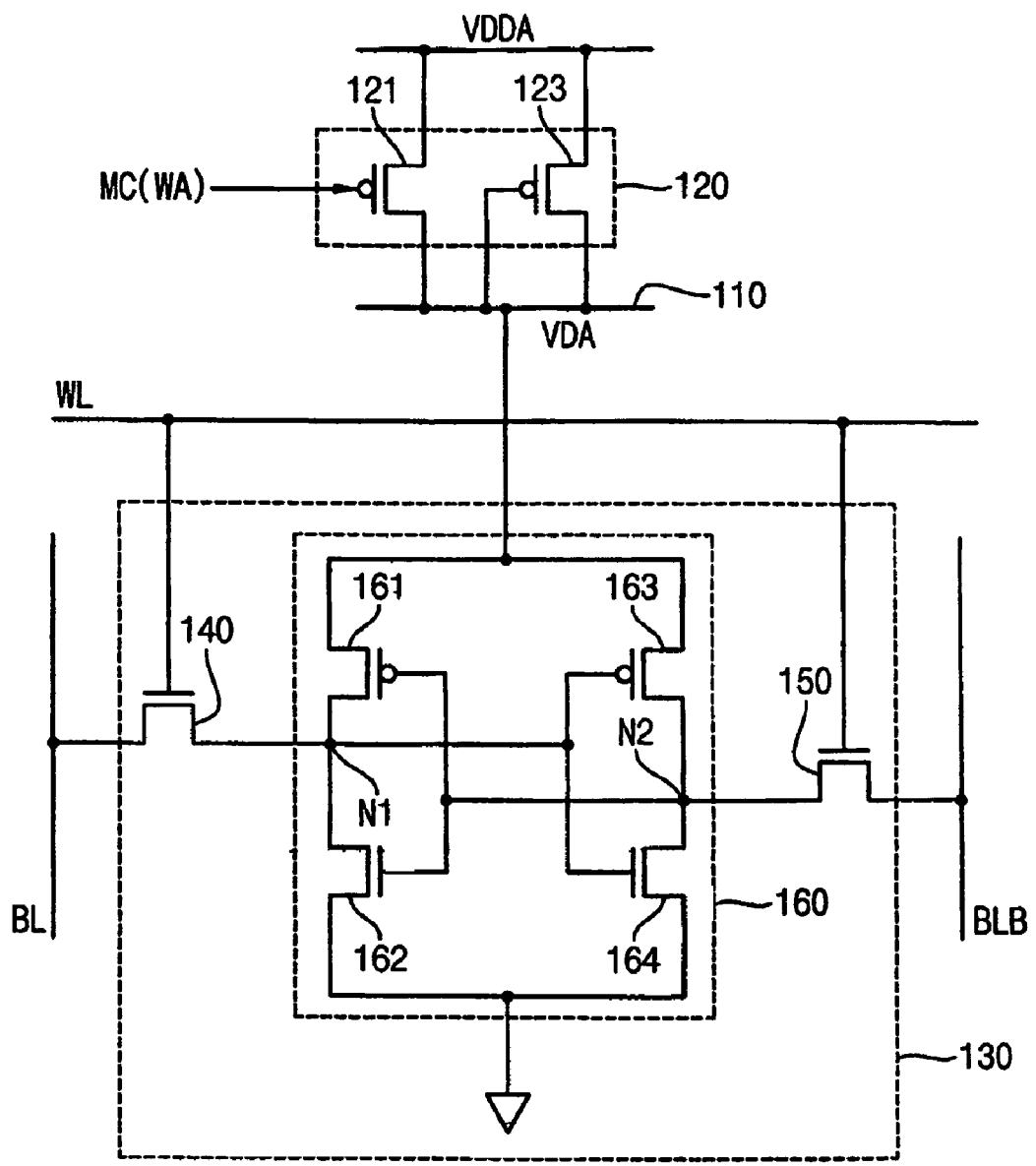
FIG. 1 illustrates a circuit diagram of a static memory device according to a first example embodiment.

Korean Patent Application No. 2008-0027756, filed on Mar. 26, 2008, in the Korean Intellectual Property Office, and entitled: "Static Memory Device and Static Random Access Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions may be exaggerated for clarity of illustration. Like reference numerals refer to like elements throughout. It will be understood that, although the terms first, second, etc., may be used herein to describe various elements, these elements should not be limited by these terms. These terms are used to distinguish one element from another. For example, a first element could be termed a second element, and, similarly, a second element could be termed a first element. As used herein, the term "and/or" includes any and all combinations of one or more of the associated listed items.

It will be understood that when an element is referred to as being is "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 6 illustrate circuit diagrams of static memory devices according to embodiments.

A structure of a bit cell (BC) 130 will now be described. The description thereof is common to FIGS. 1 to 6.

The bit cell 130 may be connected to a word line WL and a bit line pair BL and BLB, where BLB indicates bit line bar, i.e., an inverted signal of the signal on bit line BL. The bit cell 130 may include a first access transistor 140, a second access transistor 150, and a latch circuit 160. The first access transistor 140 may include a gate connected to the word line WL, and a first terminal connected to the bit line BL. The second access transistor 150 may include a gate connected to the word line WL, and a first terminal connected to the complementary bit line BLB. The latch circuit 160 for storing data may be connected between a second terminal of the first access transistor 140 and a second terminal of the second access transistor 150.

The latch circuit 160 may include a first p-type metal oxide semiconductor (PMOS) transistor 161, a first n-type metal oxide semiconductor (NMOS) transistor 162, a second PMOS transistor 163, and a second NMOS transistor 164.

One terminal of the first PMOS transistor 161 may be connected to an internal voltage line 110 having an internal voltage VDA thereon. The first NMOS transistor 162 may include one terminal connected to the other terminal of the first PMOS transistor 161, the other terminal connected to a ground GND, and a gate connected to a gate of the first PMOS transistor 161 and the other terminal of the second access transistor 150. One terminal of the second PMOS transistor 163 may be connected to the internal voltage line 110. The second NMOS transistor 164 may include one terminal connected to the other terminal of the second PMOS transistor 163 and the other terminal of the second access transistor 150, the other terminal connected to the ground GND, and a gate connected to a gate of the second PMOS transistor 163 and the other terminal of the first access transistor 140. A first node N1 and a second node N2 of the bit cell 130 may correspond to stored data which are opposite to each other. The bit cell 130 is the same in each of FIGS. 1 to 6.

FIG. 1 illustrates a circuit diagram of a static memory device according to a first example embodiment.

Referring to FIG. 1, a static memory device 100 may include the bit cell 130 and a power supply control circuit 120. The power supply control circuit 120 may be connected between a power supply voltage VDDA and the internal voltage line 110. In an implementation, respective power supply control circuits 120 may be provided per column of bit cells 130 in a memory cell array. The power supply control circuit 120 may provide the internal voltage VDA to the internal voltage line 110 based on a mode control signal group MC that corresponds to operation modes. The mode control signal group MC may include one or more signals. The mode control signal group MC may include a write assist signal WA. In other embodiments, the mode control signal group MC may include the write assist signal WA and a sleep mode signal SL, the write assist signal WA and a power down signal PD, or the write assist signal WA, the sleep mode signal SL, and the power down signal PD, as described in greater detail below.

The power supply control circuit 120 may include a first PMOS transistor 121 and a second PMOS transistor 123. The first PMOS transistor 121 may include a source connected to the power supply voltage VDDA, a drain connected to the internal voltage line 110, and a gate receiving the write assist signal WA. The second PMOS transistor 123 may include a source connected to the power supply voltage line VDDA, a drain connected to the internal voltage line 110, and a gate connected to the internal voltage line 110. The drain and the gate of the second PMOS transistor 123 may be commonly connected to the internal voltage line 110.

When the write assist signal WA applied to the gate of the first PMOS transistor 121 corresponds to a logic state "low", the first PMOS transistor 121 may thus be turned on. In this state, the internal voltage VDA may correspond to the power supply voltage VDDA, and the power supply voltage VDDA may be provided to the latch circuit 160 of the bit cell 130. In this case, a read operation may be performed on the bit cell 130.

When the write assist signal WA applied to the gate of the first PMOS transistor 121 corresponds to a logic state "high", the first PMOS transistor 121 may be turned off. The internal voltage line 110 may thus be floated, and the internal voltage VDA on the floated internal voltage line 110 may be provided to the latch circuit 160 of the bit cell 130. In this case, a write operation may be performed on the bit cell 130. As described in detail below, the floated internal voltage may be related to the power supply voltage VDDA, and the floated internal voltage may be sufficient to maintain a driving ability of the first and second PMOS transistors 161, 163 at a desired level so as to reduce or eliminate data retention failures.

Figure 7A:
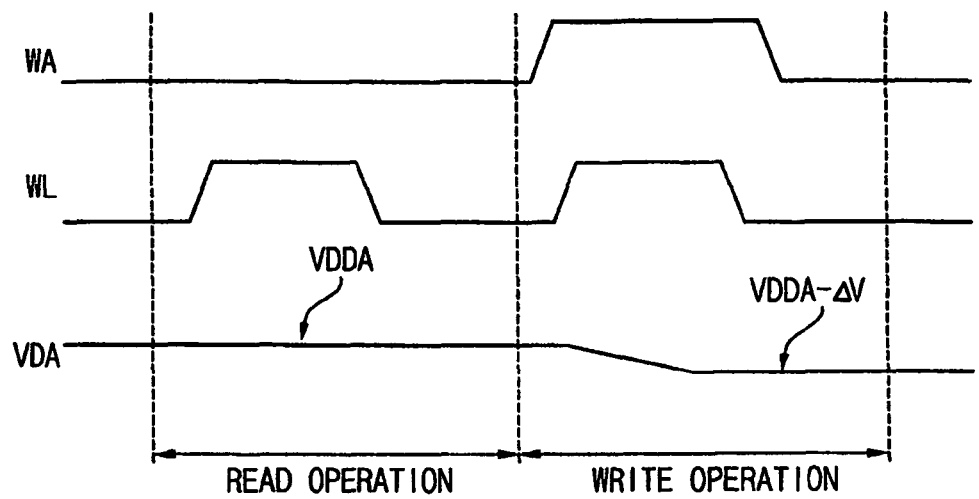
FIGS. 7A and 7B illustrate diagrams of voltage variations based on a write assist signal of a static memory device according to embodiments.

FIG. 7A illustrates a diagram of voltage variations of the static memory device according to the write assist signal.

Referring to FIGS. 1 and 7A, during the read operation on the bit cell 130, the word line WL may be enabled and the write assist signal WA may correspond to the logic state "low". Accordingly, the internal voltage VDA may correspond to the power supply voltage VDDA. Because the internal voltage VDA is maintained to the power supply voltage VDDA, the data stored in the first node N1 may be read through the bit line BL.

During the write operation on the bit cell 130, the word line WL may be enabled and the write assist signal WA may correspond to the logic state "high". Thus, the first PMOS transistor 121 may be turned off. The second transistor 123 may be diode-connected, i.e., having the gate connected in common with the drain so as to operate as a diode. Therefore, the internal voltage line 110 may be floated, such that the internal voltage VDA on the floated internal voltage line 110 has a voltage level between a first voltage level, i.e., the power supply voltage VDDA, and a second voltage level equal to subtracting a predetermined voltage level ΔV from the first voltage level corresponding to the power supply voltage VDDA. The predetermined voltage level ΔV may correspond to the threshold voltage of, e.g., a diode-connected transistor such as the second PMOS transistor 123. In other embodiments (not shown in FIG. 1), the predetermined voltage level may correspond to a threshold voltage of another transistor, e.g., a NAND transistor, in the power supply control circuit, as described below.

Cell data that has been previously stored at the first node N1 and the second node N2 may be reversed during the write operation on the bit cell 130. However, the first PMOS transistor 161 and the second PMOS transistor 163 of the latch circuit 160 may tend to maintain the data stored at the first node N1 and the second node N2, and thus the write operation may be obstructed by the tendency of the latch circuit 160 to maintain the stored data. When driving abilities of the first PMOS transistor 161 and the second PMOS transistor 163 are lower than driving abilities of the first and second access transistors 140 and 150 (that is, when the voltage supplied to the first PMOS transistor 161 and the second PMOS transistor 163, i.e., the internal voltage VDA, has a relatively low voltage level), the data stored in the first and second node N1 and N2 may be easily reversed. However, a data retention failure, i.e., a failure to write over previously-stored data with new data, or reverse previously-stored data, may occur when the internal voltage provided to the first PMOS transistor 161 and the second PMOS transistor 163 has an excessively low voltage level. Because the internal voltage line 110 according to the example embodiment is floated, and the internal voltage VDA on the floated internal voltage line 110 has a voltage level between a voltage level of the power supply voltage VDDA and a voltage level (VDDA-ΔV) obtained by subtracting the predetermined voltage level ΔV from the voltage level of the power supply voltage VDDA, the data retention failure may be prevented and the static memory device 100 may stably perform the write operation. Moreover, a write assist function that lowers the internal voltage by the predetermined voltage level may be exclusively performed in an unstable memory cell during the write operation, so that the static memory device performing the write assist function according to embodiments may reduce power consumption.

Figure 2:
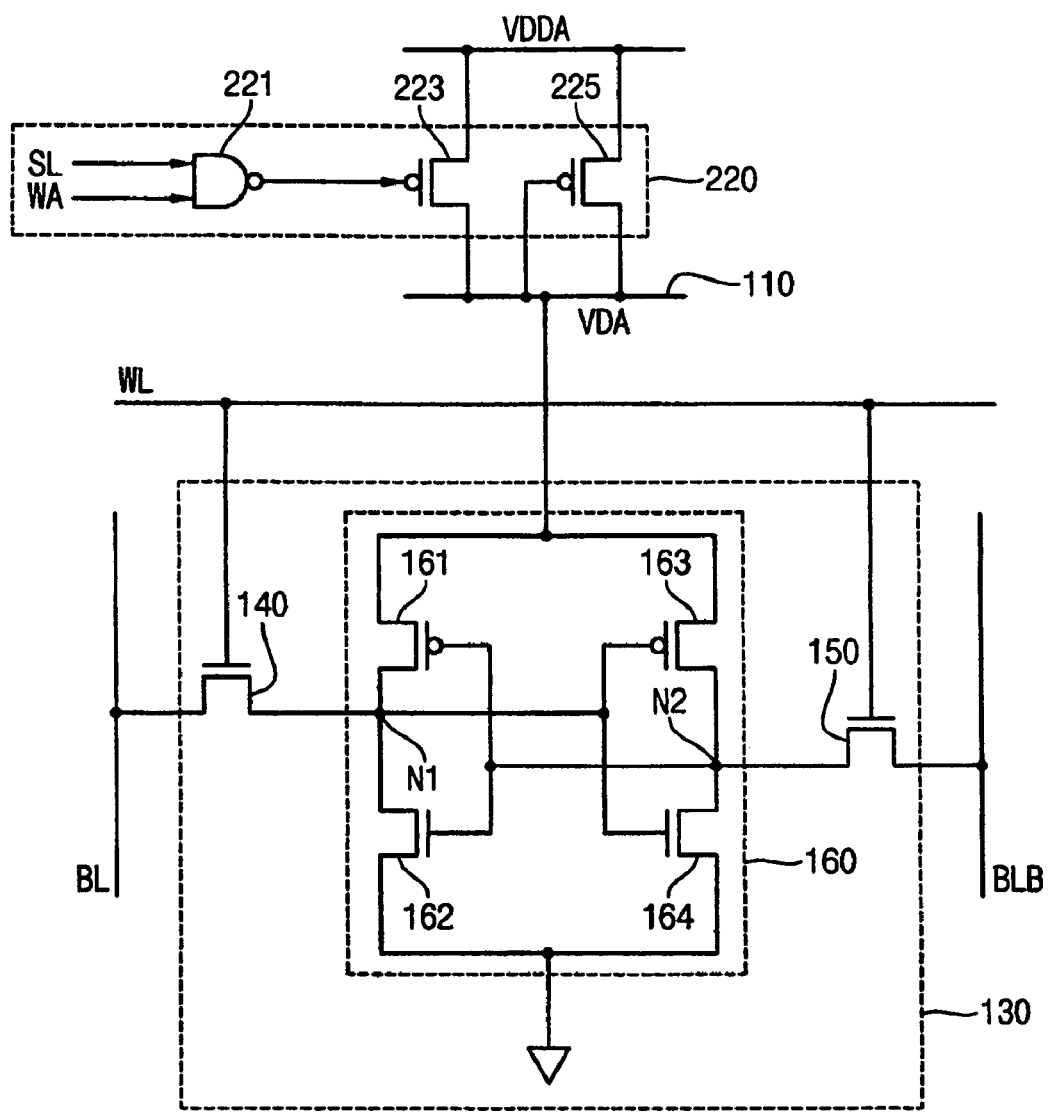
FIG. 2 illustrates a circuit diagram of a static memory device according to a second example embodiment.

FIG. 2 illustrates a circuit diagram of a static memory device 200 according to an example embodiment.

The static memory device 200 may perform the write assist operation and may additionally perform a sleep mode operation.

Referring to FIG. 2, the static memory device 200 may include the bit cell 130 and a power supply control circuit 220. The power supply control circuit 220 may be connected between the power supply voltage VDDA and the internal voltage line 110. The power supply control circuit 220 may provide the internal voltage VDA based on the mode control signal group MC corresponding to the operation modes. The mode control signal group MC may include the write assist signal WA and a sleep mode signal SL.

The power supply control circuit 220 may include a NAND gate 221, a first PMOS transistor 223, and a second PMOS transistor 225. The NAND gate 221 may receive the sleep mode signal SL and the write assist signal WA. The first PMOS transistor 223 may include a source connected to the power supply voltage VDDA, a drain connected to the internal voltage line 110, and a gate receiving an output signal from the NAND gate 221. The second PMOS transistor 225 may include a source connected to the power supply voltage VDDA, a drain connected to the internal voltage line 110, and a gate connected to the internal voltage line 110. The drain of the second PMOS transistor 225 may be connected in common with the gate of the second PMOS transistor 225.

When the sleep mode signal corresponds to the logic state "low", the bit cell 130 may operate in a sleep mode regardless of a logic state of the write assist signal WA.

When the sleep mode signal SL and the write assist signal WA correspond to the logic state "high", the output signal of the NAND gate 221 may correspond to the logic state "low", and thus the first PMOS transistor 223 may be turned on. In this state, the voltage on the internal voltage line 110 may correspond to the power supply voltage VDDA, and the power supply voltage VDDA may be provided to the latch circuit 160 of the bit cell 130. In this state, the read operation may be performed on the bit cell 130.

When the sleep mode signal SL corresponds to the logic state "high" and the write assist signal WA corresponds to the logic state "low", the output signal of the NAND gate 221 may correspond to the logic state "high", and thus the first PMOS transistor 223 may be turned off. In this state, the second PMOS transistor 225 having the drain and the gate commonly connected to the internal voltage line 110 may operate as a diode. Therefore, the internal voltage line 110 may be floated, and the floated internal voltage VDA may be supplied to the latch circuit 160 of the bit cell 130. In this state, the write operation may be performed on the bit cell 130.

Figure 7B:
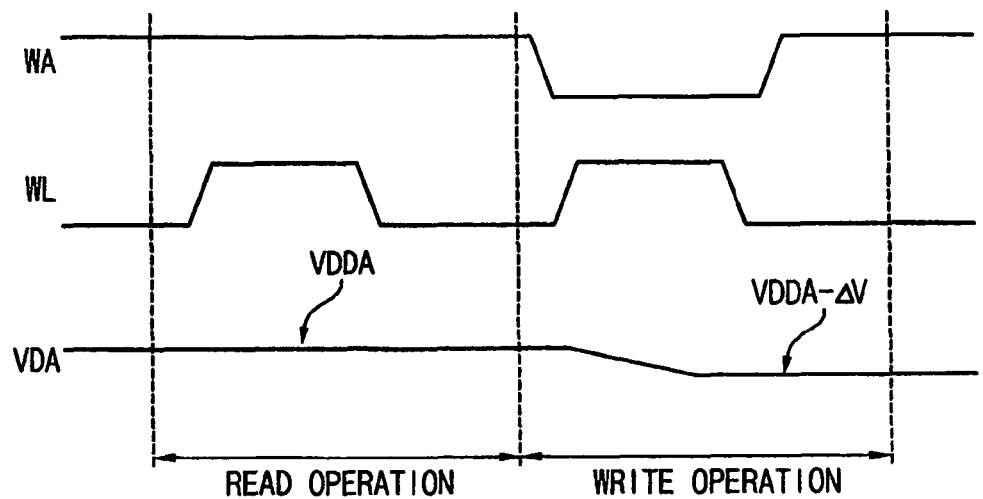

FIG. 7B illustrates a diagram of voltage variations of the static memory device according to the write assist signal.

Referring to FIGS. 2 and 7B, during the read operation on the bit cell 130, the word line WL may be enabled, the write assist signal WA may correspond to the logic state "high", and the sleep mode signal may correspond to the logic state "high". Accordingly, the voltage on the internal voltage VDA may correspond to the power supply voltage VDDA, and thus the data stored in the first node N1 may be read through the bit line BL.

During the write operation on the bit cell 130, the word line WL may be enabled, the write assist signal WA may correspond to the logic state "low", and the sleep mode signal may correspond to the logic state "high". Accordingly, the first PMOS transistor 223 may be turned off, and the second transistor 225 having the gate and the drain commonly connected to the internal voltage line 110 may operate as a diode. The internal voltage line 110 may be floated to have a voltage level between a first voltage level corresponding to the power supply voltage VDDA and a second voltage level. The second voltage level may correspond to a voltage level that is less than the power supply voltage VDDA by an amount equal to a predetermined voltage level $\Delta V$, such as a threshold voltage level of the second PMOS transistor 123. Operation of the static memory device 200 of FIG. 2 may be substantially the same as the operation of the static memory device 100 of FIG. 1.

Figure 3:
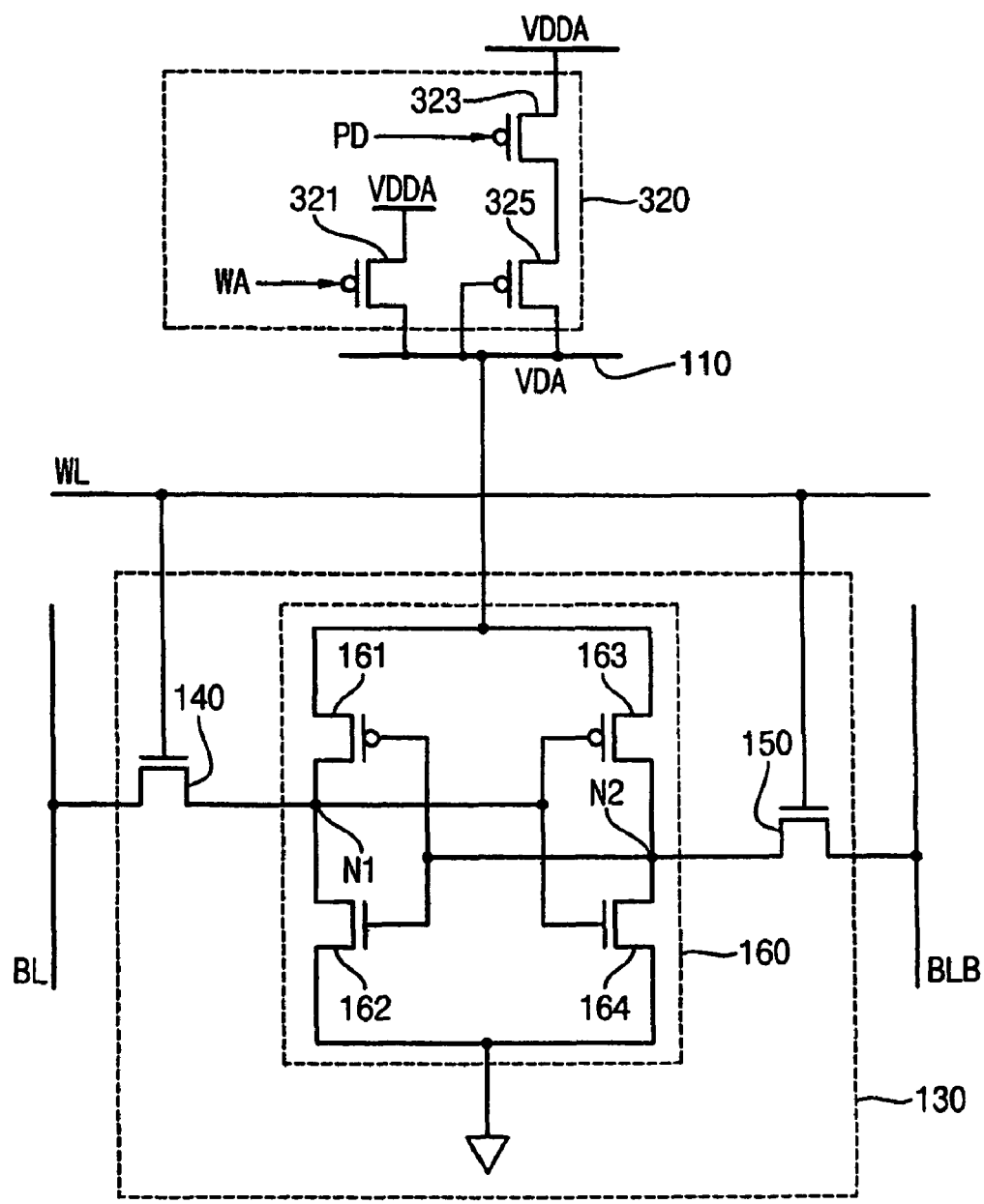
FIG. 3 illustrates a circuit diagram of a static memory device according to a third example embodiment.

FIG. 3 illustrates a circuit diagram of a static memory device 300 according to an example embodiment.

The static memory device 300 of FIG. 3 may perform the write assist operation and may additionally perform a power down mode operation.

Referring to FIG. 3, the static memory device 300 may include the bit cell 130 and a power supply control circuit 320. The power supply control circuit 320 may be connected between the power supply voltage VDDA and the internal voltage line 110. The power supply control circuit 320 may provide or block the internal voltage VDA on the internal voltage line 110 to the bit cell 130 based on the mode control signal group MC corresponding to the operation mode. The mode control signal group MC may include the write assist signal WA and a power down signal PD.

The power supply control circuit 320 may include a first PMOS transistor 321, a second PMOS transistor 323, and a third PMOS transistor 325. The first PMOS transistor 321 may include a source connected to the power supply voltage VDDA, a drain connected to the internal voltage line 110, and a gate receiving the write assist signal WA. The second PMOS transistor 323 may include a source connected to the power supply voltage VDDA, and a gate receiving the power down signal PD. The third PMOS transistor 325 may include a source connected to a drain of the second PMOS transistor 323, a gate connected to the internal voltage line 110, and a drain connected to the internal voltage line 110. The gate of the third PMOS transistor 325 may be connected to the internal voltage line 110 in common with the drain of the third PMOS transistor 325.

When the power down signal PD corresponds to the logic state "high", the second PMOS transistor 323 may be turned off. Thus, the power supply voltage VDDA may not be provided to the internal voltage line 110. The case where the power supply voltage VDDA is blocked is referred to as a power down mode. The power supply control circuit 320 may operate as a power gating circuit.

When the power down signal PD and the write assist signal WA correspond to the logic state "low", the first PMOS transistor 321 and the second PMOS transistor 323 may be turned on. Thus, the power supply voltage VDDA may be provided to the latch circuit 160 of the bit cell 130 through the internal voltage line 110. In this case, the read operation may be performed on the bit cell 130.

When the power down signal PD corresponds to the logic state "low" and the write assist signal WA corresponds to the logic state "high", the second PMOS transistor 323 may be turned on and the third PMOS transistor 325 having a drain connected to the internal voltage line 110 in common with a gate may operate as a diode. Thus, the internal voltage line 110 may be floated and the floated internal voltage VDA may be supplied to the latch circuit 160 of the bit cell 130. In this case, the write operation may be performed on the bit cell 130.

Voltage variations of the static memory device 300 of FIG. 3 may be illustrated as shown in FIG. 7A. The predetermined value $\Delta V$ may correspond to, e.g., a threshold voltage level of the diode-connected third PMOS transistor 325.

Operation of the static memory device 300 of FIG. 3 may be substantially the same as the operation of the static memory device 100 of FIG. 1.

Figure 4:
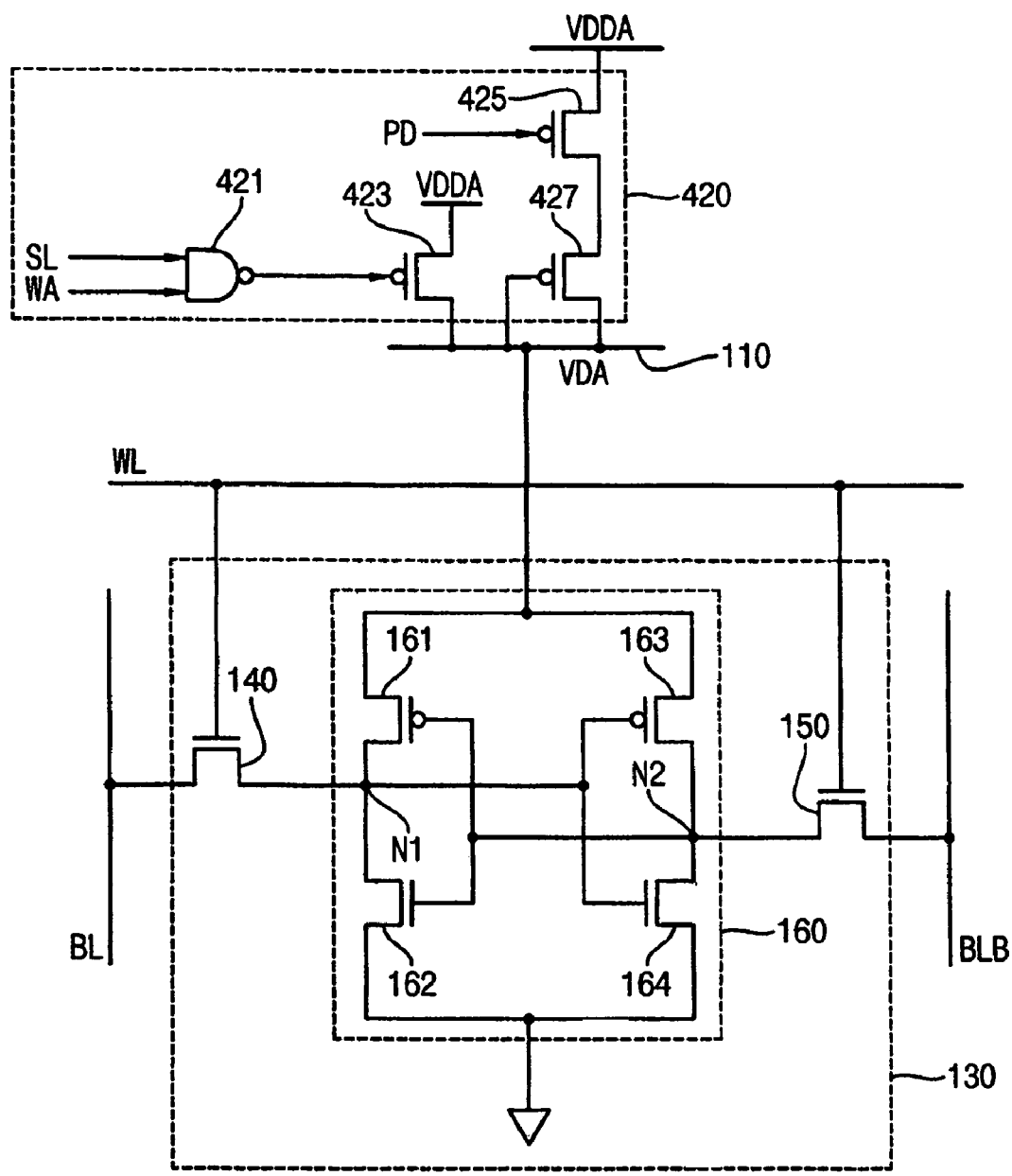
FIG. 4 illustrates a circuit diagram of a static memory device according to a fourth example embodiment.

FIG. 4 illustrates a circuit diagram of a static memory device 400 according to an example embodiment.

The static memory device 400 may perform the write assist operation, the power down mode operation, and the sleep mode operation.

Referring to FIG. 4, the static memory device 400 may include the bit cell 130 and a power supply control circuit 420. The power supply control circuit 420 may be connected between the power supply voltage VDDA and the internal voltage line 110. The power supply control circuit 420 may provide the internal voltage VDA to the bit cell 130, or may block the power supply voltage VDDA to the bit cell 130, based on the mode control signal group MC corresponding to the operation mode. The mode control signal group MC may include the write assist signal WA, the power down signal PD, and the sleep mode signal SL.

The power supply control circuit 420 may include a NAND gate 421, a first PMOS transistor 423, a second PMOS transistor 425, and a third PMOS transistor 427. The NAND gate 421 may receive the write assist signal WA and the sleep mode signal SL. The first PMOS transistor 423 may include a source connected to the power supply voltage VDDA, a drain connected to the internal voltage line 110, and a gate receiving an output signal from the NAND gate 421. The second PMOS transistor 425 may include a source connected to the power supply voltage VDDA and a gate receiving the power down signal PD. The third PMOS transistor 427 may include a source connected to a drain of the second PMOS transistor 425, and a gate connected to the internal voltage line 110 in common with a drain of the second PMOS transistor 425.

When the power down signal PD corresponds to the logic state "high" and the sleep mode signal corresponds to the logic state "high", the second PMOS transistor 425 may be turned off regardless of the state of the write assist signal WA, so that the power supply voltage VDDA is blocked, i.e., so that the device is in the power down mode. The power supply control circuit 420 in FIG. 4 may operate as the power gating circuit.

When the power down signal PD corresponds to the logic state "low" and the sleep mode signal SL corresponds to the logic state "high", the first PMOS transistor 423 may be turned off. Thus, the bit cell 130 may operate in the sleep mode regardless of the state of the write assist signal WA.

When the power down signal PD corresponds to the logic state "low", the sleep mode signal SL corresponds to the logic state "high", and the write assist signal WA corresponds to the logic state "high", the first PMOS transistor 423 is turned on. Thus, the power supply voltage VDDA may be provided to the latch circuit 160 of the bit cell 130 through the internal voltage line 110. In this case, the read operation may be performed on the bit cell 130.

During the write operation, the power down signal PD may correspond to the logic state "low", the sleep mode signal SL may correspond to the logic state "high", and the write assist signal WA may correspond to the logic state "low". In this state, the first PMOS transistor 423 may be turned off, the second PMOS transistor 425 may be turned on, and the third PMOS transistor 427 having the gate connected to the internal voltage line 110 in common with the drain may operate as a diode. Therefore, the internal voltage line 110 may be floated and the internal voltage VDA may be supplied to the latch circuit 160 of the bit cell 130. In this case, the write operation may be performed on the bit cell 130.

Voltage variations of the static memory device 400 of FIG. 4 are illustrated in FIG. 7B. The predetermined value ΔV may correspond to a threshold voltage level of the diode-connected third PMOS transistor 427.

Operation of the static memory device 400 of FIG. 4 may be substantially the same as the operation of the static memory device 100 of FIG. 1.

Figure 5:
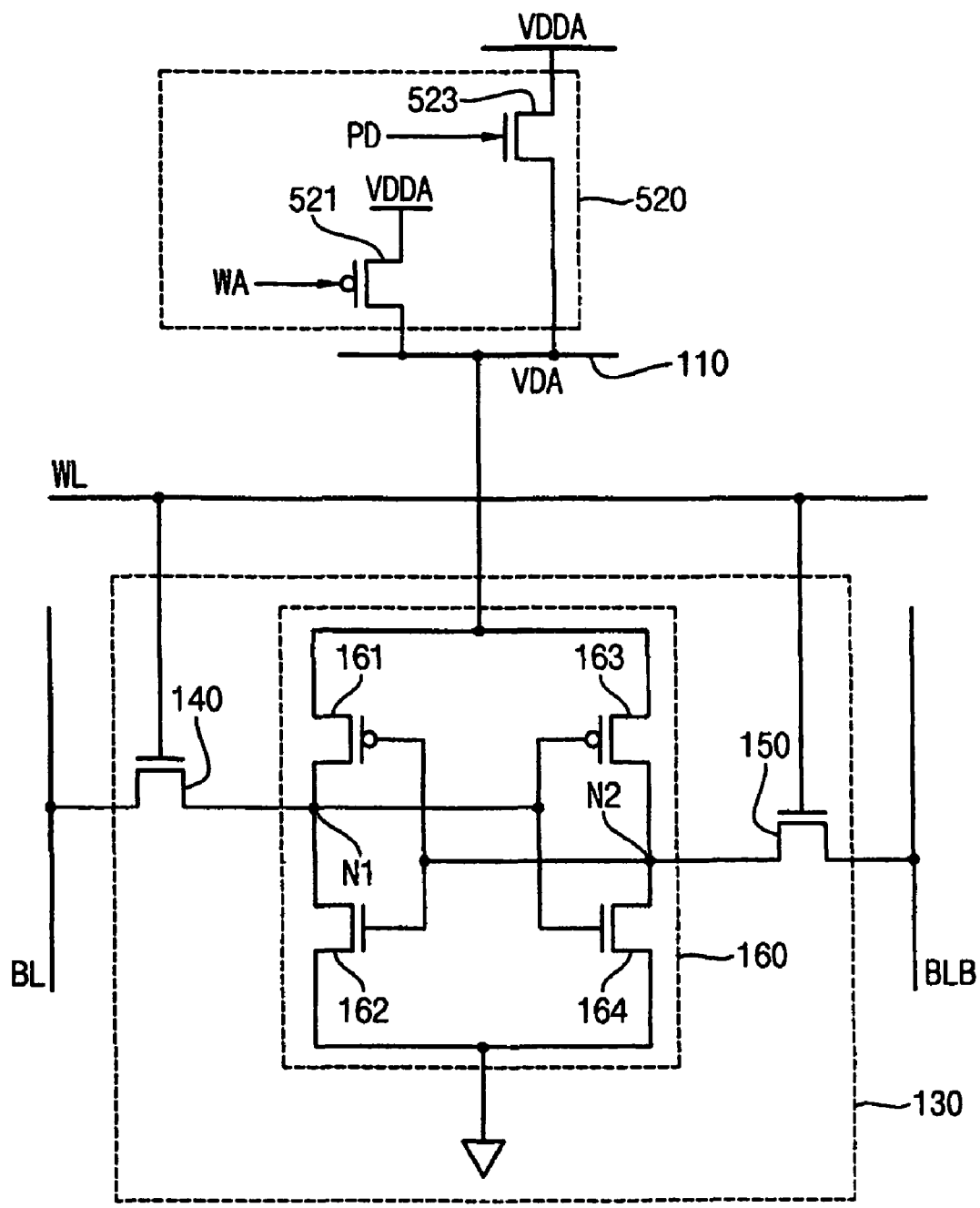
FIG. 5 illustrates a circuit diagram of a static memory device according to a fifth example embodiment.

FIG. 5 illustrates a circuit diagram of a static memory device 500 according to an example embodiment.

The static memory device 500 of FIG. 5 may perform the write assist operation and may additionally perform the power down mode operation similarly to the static memory device 300 of FIG. 3.

Referring to FIG. 5, the static memory device 500 may include the bit cell 130 and a power supply control circuit 520. The power supply control circuit 520 may be connected between the power supply voltage VDDA and the internal voltage line 110. The power supply control circuit 520 may provide the internal voltage VDA, or may block the power supply voltage VDDA, based on the mode control signal group MC corresponding to the operation mode. The mode control signal group MC may include the write assist signal WA and the power down signal PD.

The power supply control circuit 520 may include a PMOS transistor 521 and an NMOS transistor 523. The PMOS transistor 521 may include a source connected to the power supply voltage VDDA, a drain connected to the internal voltage line 110, and a gate receiving the write assist signal WA. The NMOS transistor 523 may include a drain connected to the power supply voltage VDDA, a gate receiving the power down signal PD, and a source connected to the internal voltage line 110.

When the power down signal PD corresponds to the logic state "low" and the write assist signal WA corresponds to the logic state "high", the PMOS transistor 521 and the NMOS transistor 523 may be turned off. Thus, the power supply voltage VDDA may be blocked. The power supply control circuit 520 may operate as the power gating circuit.

When the power down signal PD corresponds to the logic state "high" and the write assist signal WA corresponds to the logic state "low", the PMOS transistor 521 and the NMOS transistor 523 may be turned on. In this state, the power supply voltage VDDA may be provided to the latch circuit 160 of the bit cell 130 through the internal voltage line 110. In this case, the read operation may be performed on the bit cell 130.

When the write assist signal WA corresponds to the logic state "high" and the power down signal PD corresponds to the logic state "high", the PMOS transistor 521 may be turned off and the NMOS transistor 523 may be turned on. In this state, the internal voltage line 110 may be floated and the floated internal voltage VDA may be supplied to the latch circuit 160 of the bit cell 130. In this case, the write operation may be performed on the bit cell 130. The NMOS transistor 523 in the static memory device 500 of FIG. 5 may substitute for the second PMOS transistor 323 and the third NMOS transistor 325 in the static memory device 300 of FIG. 3.

Voltage variations of the static memory device 500 of FIG. 5 are illustrated in FIG. 7A. The predetermined voltage level ΔV may correspond to a threshold voltage level of the NMOS transistor 523.

Operation of the static memory device 500 of FIG. 5 may be substantially the same as the operation of the static memory device 100 of FIG. 1.

Figure 6:
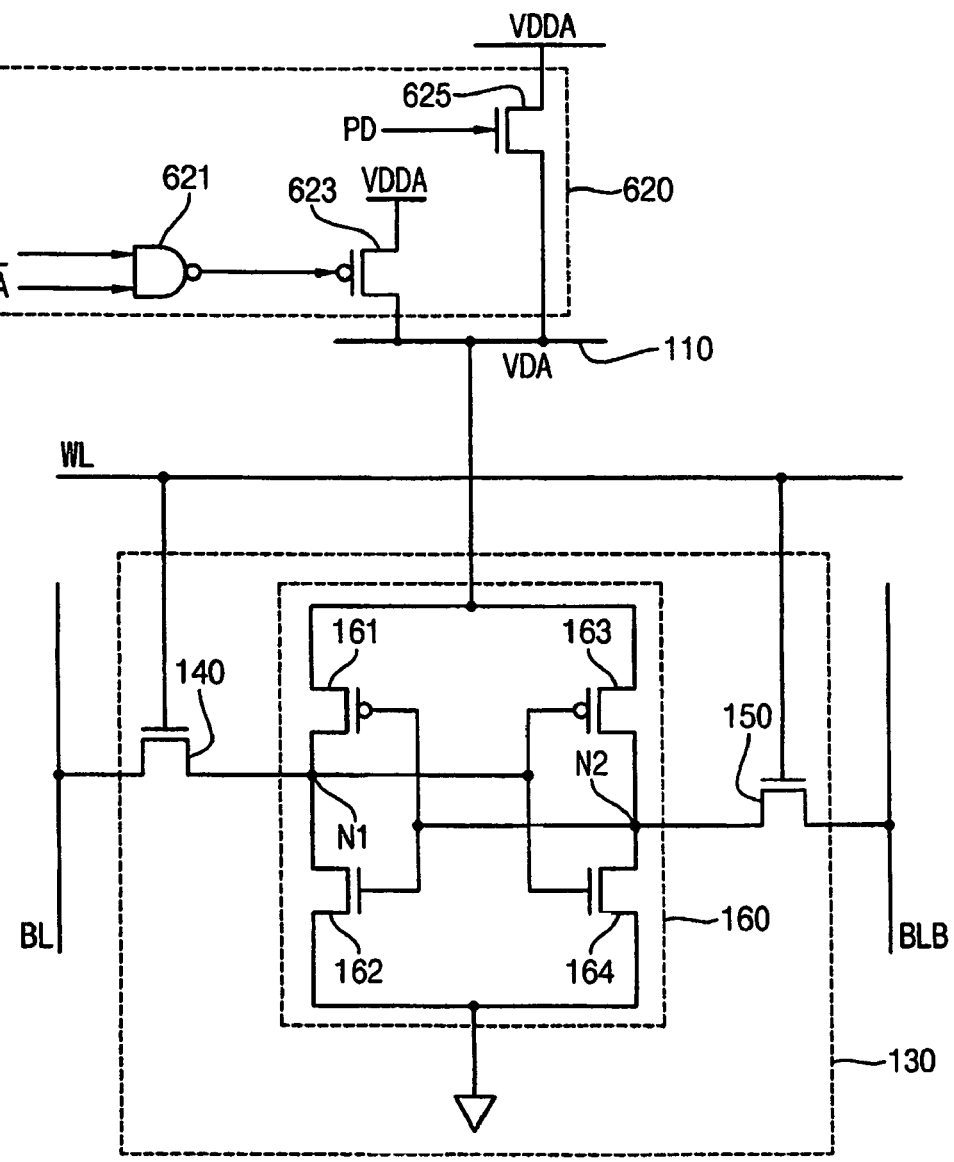
FIG. 6 illustrates a circuit diagram of a static memory device according to a sixth example embodiment.

FIG. 6 illustrates a circuit diagram of a static memory device 600 according to an example embodiment.

The static memory device 600 may perform the write assist operation, the power down mode operation, and the sleep mode operation.

Referring to FIG. 6, the static memory device 600 may include the bit cell 130 and a power supply control circuit 620. The power supply control circuit 620 may be connected between the power supply voltage VDDA and the internal voltage line 110. The power supply control circuit 620 may provide the internal voltage VDA, or may block the power supply voltage VDDA, based on the mode control signal group MC corresponding to the operation mode. The mode control signal group MC may include the write assist signal WA, the power down signal PD, and the sleep mode signal SL.

The power supply control circuit 620 may include a NAND gate 621, a PMOS transistor 623, and an NMOS transistor 625. The NAND gate 621 may receive the write assist signal WA and the sleep mode signal SL. The PMOS transistor 623 may include a source connected to the power supply voltage VDDA, a drain connected to the internal voltage line 110, and a gate receiving an output signal from the NAND gate 621. The NMOS transistor 625 may include a drain connected to the power supply voltage VDDA, a gate receiving the power down signal PD, and a source connected to the internal voltage line 110.

When the power down signal PD corresponds to the logic state "low" and the sleep mode signal SL corresponds to the logic state "low", the PMOS transistor 623 and the NMOS transistor 625 may be turned off regardless of the state of the write assist signal WA. In this state, the power supply voltage VDDA may be blocked. The power supply control circuit 620 may operate as the power gating circuit.

When the power down signal PD corresponds to the logic state "high" and the sleep mode signal SL corresponds to the logic state "low", the bit cell 130 may operate in the sleep mode regardless of the state of the write assist signal WA.

When the power down signal PD corresponds to the logic state "high", the sleep mode signal SL corresponds to the logic state "high", and the write assist signal WA corresponds to the logic state "high", the PMOS transistor 623 and the NMOS transistor 625 may be turned on. In this state, the power supply voltage VDDA may be provided to the latch circuit 160 of the bit cell 130 through the internal voltage line 110. In this case, the read operation may be performed on the bit cell 130.

When the power down signal PD corresponds to the logic state "high", the sleep mode signal SL corresponds to the logic state "high", and the write assist signal WA corresponds to the logic state "low", the PMOS transistor 623 may be turned off and the NMOS transistor 625 is turned on. In this state, the internal voltage line 110 may be floated and the internal voltage VDA may be supplied to the latch circuit 160 of the bit cell 130. In this case, the write operation may be performed on the bit cell 130. The NMOS transistor 625 in the static memory device 600 of FIG. 6 may substitute for the second PMOS transistor 425 and the third PMOS transistor 427 in the static memory device 400 of FIG. 4.

Voltage variations of the static memory device 600 of FIG. 6 are illustrated in FIG. 7B. The predetermined voltage level ΔV may correspond to a threshold voltage level of the NMOS transistor 625.

Figure 8A:
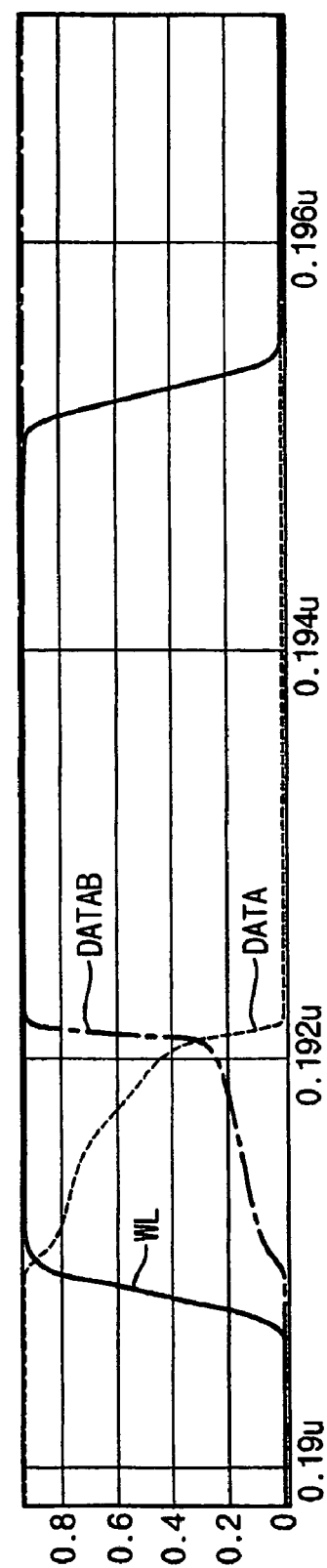
FIGS. 8A to 8C illustrate diagrams of simulation results of a conventional static memory device and a static memory device according to embodiments.
Figure 8B:
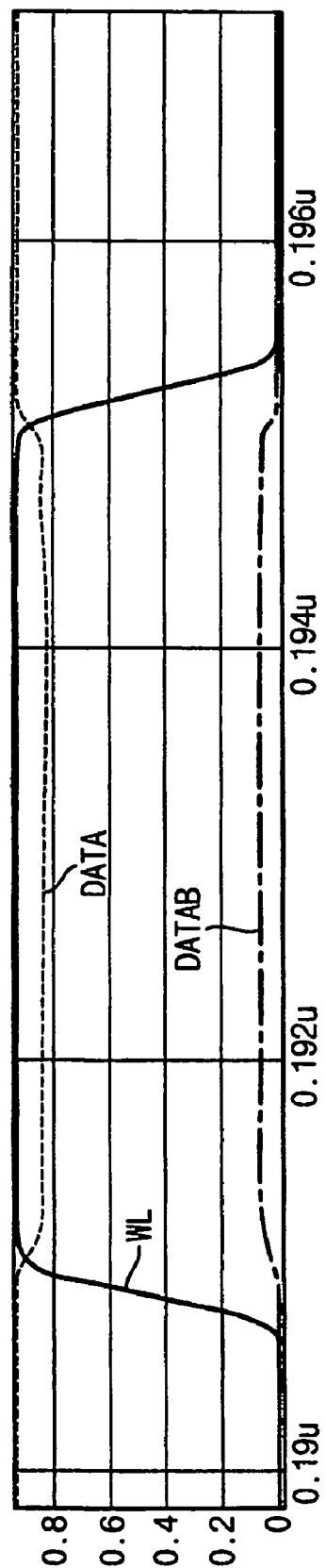
Figure 8C:
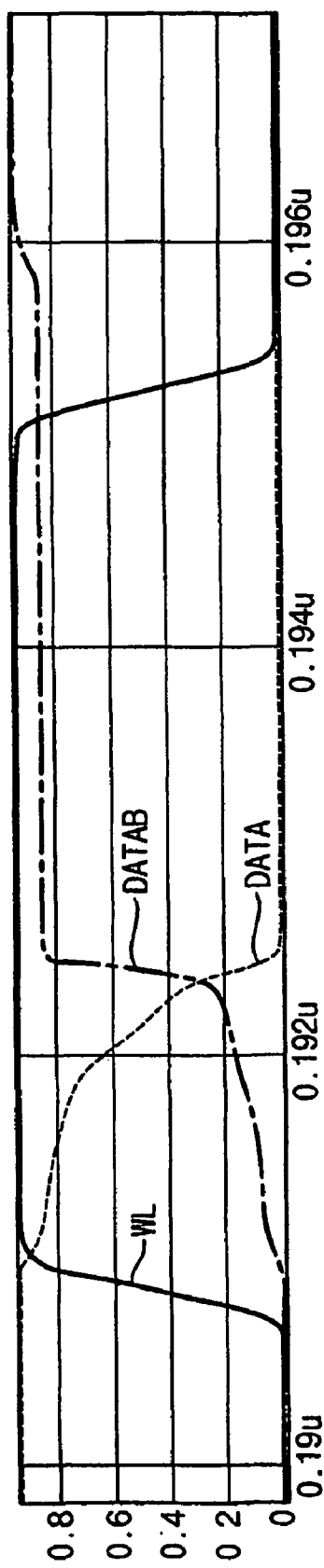

FIGS. 8A to 8C illustrate diagrams of simulation results of a conventional static memory device and a static memory device according to embodiments.

In particular, FIG. 8A illustrates a diagram of a simulation result in a stable bit cell, FIG. 8B illustrates a diagram of a simulation result in a conventional unstable bit cell, and FIG. 8C illustrates a diagram of a simulation result in an unstable bit cell of a static memory device performing the write assist function according to embodiments.

Referring to FIG. 8A, when the word line WL is enabled, voltages DATA and DATAB at the first node N1 and the second node N2 of the stable bit cell are flipped between voltage variations of the word line WL during the write operation, i.e., the write operation successfully writes data to the bit cell.

FIG. 8B illustrates a conventional case of a write operation on an unstable bit cell, where a write assist function is not performed. Referring to FIG. 8B, voltages DATA and DATAB at the first node N1 and the second node N2 of the unstable bit cell are not flipped, i.e., a retention failure occurs, even though the word line WL is enabled.

FIG. 8C illustrates a case where a write operation including the write assist function according to embodiments is performed on an unstable bit cell. Referring to FIG. 8C, voltages DATA and DATAB at the first node N1 and the second node N2 of the unstable bit cell are flipped successfully, i.e., a retention failure does not occur, although the voltages are flipped in a slightly narrowed range as compared to the range of voltage variation of the word line WL.

Figure 9:
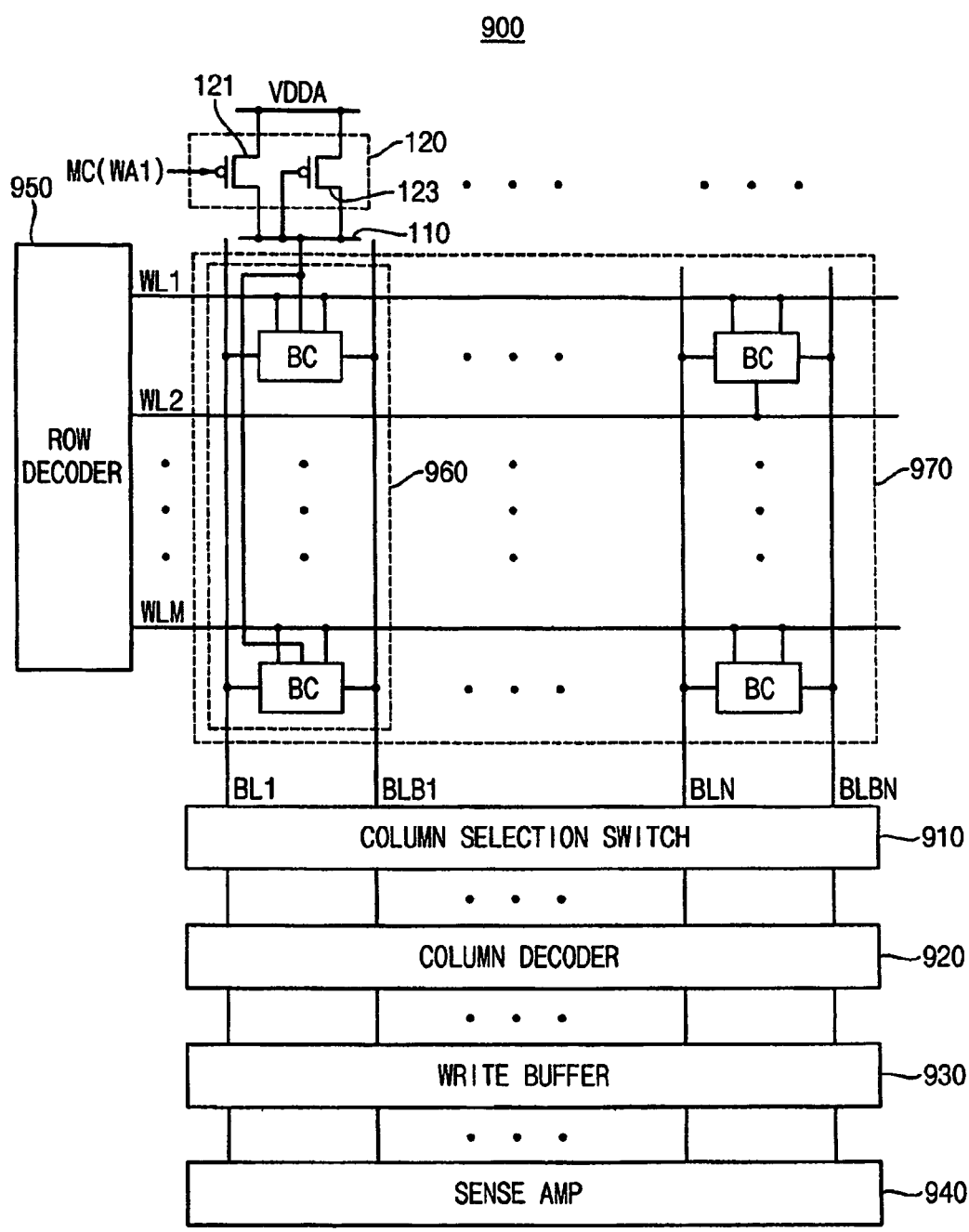
FIG. 9 is a block diagram illustrating static random access memory device performing a write assist function according to embodiments.

FIG. 9 illustrates a block diagram of a static random access memory (SRAM) device 900 including a static memory device according to an embodiment. The SRAM device 900 may perform the write assist function Referring to FIG. 9, the SRAM device may include a plurality of word lines WL1, WL2, to WLM, a plurality of bit lines BL1 to BLN, each of which may be paired with respective members of a plurality of complementary bit lines BLB1 to BLBN, an M-row by N-column bit cell array 970, a row decoder 950, a column decoder 920, a column selection switch 910, a write buffer 930, a sense amp (amplifier) 940, and at least one power supply control circuit 120.

Each of the bit line pairs (BL1, BLB1) to (BLN, to BLBN) may include respective ones of the bit lines BL1 to BLN and the complementary bit lines BLB1 to BLBN. The row decoder 950 may select one of the word lines WL1, WL2, to WLM in response to a row address signal XADDR applied from an external source. The column decoder 920 may generate a column selection signal for selecting one of the bit line pairs (BL1, BLB1) to (BLN, BLBN) in response to a column address signal YADDR applied from an external source, and may output the column selection signal to the column selection switch 910. The column selection switch 910 may receive the column selection signal and may select one of the bit line pairs (BL1, BLB1) to (BLN, BLBN). The column selection switch 910 may be implemented using a plurality of transistors. The write buffer 930 may write input data DI applied from an external source into the selected bit cell during the write operation. The sense amplifier 940 may amplify a voltage difference between the bit line and the complementary bit line connected with the selected bit cell, and may generate logic level output data DO, during the read operation. A bit cell array column 960 may include a plurality of bit cells BC. Each bit cell BC may be respectively connected to one of the word lines WL1, WL2, to WLM, and connected between one of the bit line pairs (BL1, BLB1) to (BLN, BLBN). Each bit cell BC may store cell data.

The SRAM device 900 performing the write assist function according to embodiments may include at least one power supply control circuit 120. In an implementation, the SRAM device 900 may include a single power supply control circuit 120 per column 960 of bit cells BC. The power supply control circuit 120 may be connected between the power supply voltage VDDA and the internal voltage line 110, and may provide the internal voltage VDA, or block the power supply voltage VDDA, based on the state of signals in the mode control signal group MC. The power supply control circuit 120 may include the first PMOS transistor 121 and the second PMOS transistor 123. The mode control signal group MC may include a write assist signal WA1. The power supply control circuit 120 may be implemented as the power supply control circuits 220, 320, 420, 520, and/or 620 that are described above with reference to FIGS. 2 to 6. According to embodiments, the mode control signal group MC may include the write assist signal WA, the write assist signal WA and the sleep mode signal SL, or the write assist signal WA, the sleep mode signal SL, and the power down signal PD, according to the power supply control circuits.

When the write assist signal WA1 corresponds to the logic state "high", the first PMOS transistor 121 may be turned off. Thus, the internal voltage line 110 may be floated. In this state, the internal voltage VDA on the floated internal voltage line 110 may be supplied to the latch circuit 160 of the bit cell 130. In this case, the write operation may be performed on the bit cell 130.

An operation of the SRAM device performing the write assist function may be substantially the same as the operations of the static memory devices of FIGS. 1 to 6 described above.

As described above, a static memory device according to embodiments may stably perform the write assist function at a low voltage with simple structures, and may operate in various operation modes based on signals of a mode control signal group. A method of operating an SRAM device having a bit cell coupled to a power supply control circuit via an internal voltage line may include providing a power supply voltage from the power supply control circuit via the internal voltage line to the bit cell, and, during a write operation on the bit cell, using a control signal of a mode control signal group to operate the power supply control circuit in a write assist mode, the power supply control circuit floating the internal voltage line during the write assist mode. Consequently, a static memory device including a power supply control circuit according to embodiments may stably perform a write operation without degrading retention stability of the bit cell. Further, the write assist function may be exclusively performed in an unstable bit cell, so that the static memory device may reduce power consumption. Therefore, a static memory device according to embodiments may be applicable to a sub-micron SRAM design providing low power consumption and high stability.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A static memory device, comprising:
a bit cell connected to an internal voltage line; and
a power supply control circuit connected between the internal voltage line and a power supply voltage, wherein:
the power supply control circuit is configured to supply a power supply voltage level to the internal voltage line,
the power supply control circuit is configured to perform a write assist function that includes floating the internal voltage line during a write operation on the bit cell, the internal voltage line being floated in response to a signal of a mode control signal group, wherein the mode control signal group includes a write assist signal and a sleep mode signal, and
the power supply control circuit includes a NAND gate configured to receive the write assist signal and the sleep mode signal, a first PMOS transistor including a source connected to the power supply voltage, a drain connected to the internal voltage line, and a gate configured to receive an output signal from the NAND gate, and a second PMOS transistor including a source connected to the power supply voltage, a gate connected to the internal voltage line, and a drain connected to the internal voltage line.

2. The static memory device as claimed in claim 1, wherein:
the power supply control circuit is configured to float the internal voltage line at the bit cell when the sleep mode signal corresponds to a logic state "high" and the write assist signal corresponds to a logic state "low" during the write operation, and
the floated internal voltage line has a voltage level between a first voltage level corresponding to the power supply voltage and a second voltage level that is less than the power supply voltage by an amount equal to a threshold voltage level of the second PMOS transistor.

3. A static random access memory (SRAM) device, comprising:
a plurality of word lines;
a plurality of bit line pairs;
a plurality of bit cells, each bit cell being connected to an internal voltage line, a word line, and a bit line pair, the plurality of bit cells including rows and columns for storing data; and
at least one power supply control circuit connected between a power supply voltage and the internal voltage line, wherein:
the power supply control circuit is configured to supply a power supply voltage level to the internal voltage line,
the power supply control circuit is configured to perform a write assist function that includes floating the internal voltage line during a write operation on the bit cell, the internal voltage line being floated in response to a signal of a mode control signal group, wherein the mode control signal group includes a write assist signal and a sleep mode signal, and
the power supply control circuit includes a NAND gate configured to receive the write assist signal and the sleep mode signal, a first PMOS transistor including a source connected to the power supply voltage, a drain connected to the internal voltage line, and a gate configured to receive an output signal from the NAND gate, and a second PMOS transistor including a source connected to the power supply voltage, a gate connected to the internal voltage line, and a drain connected to the internal voltage line.

4. The SRAM device as claimed in claim 3, wherein each of the bit cells includes:
a first access transistor including a gate connected to a word line of the plurality of word lines and a first terminal connected to a first bit line of a corresponding bit line pair of the plurality of bit line pairs;
a second access transistor including a gate connected to the word line and a first terminal connected to a second bit line of the corresponding bit line pair; and
a latch circuit connected between the internal voltage line and a ground voltage, and connected between second terminals of the first access transistor and the second access transistor.

5. A static random access memory system, comprising:
a memory cell array including a plurality of bit cells;
driving circuits including row and address decoders that operate bit cells of the memory cell array;
a sense amp outputting logic level signals from the memory cell array; and
at least one power supply control circuit connected between a power supply voltage and an internal voltage line providing power to a bit cell of the plurality of bit cells, wherein:
the power supply control circuit is configured to supply a power supply voltage level to the internal voltage line,
the power supply control circuit is configured to perform a write assist function that includes floating the internal voltage line during a write operation on the bit cell, the internal voltage line being floated in response to a signal of a mode control signal group, wherein the mode control signal group includes a write assist signal and a sleep mode signal, and
the power supply control circuit includes a NAND gate configured to receive the write assist signal and the sleep mode signal, a first PMOS transistor including a source connected to the power supply voltage, a drain connected to the internal voltage line, and a gate configured to receive an output signal from the NAND gate, and a second PMOS transistor including a source connected to the power supply voltage, a gate connected to the internal voltage line, and a drain connected to the internal voltage line.

6. A static memory device, comprising:
a bit cell connected to an internal voltage line; and
a power supply control circuit connected between the internal voltage line and a power supply voltage, wherein:
the power supply control circuit is configured to supply a power supply voltage level to the internal voltage line,
the power supply control circuit is configured to perform a write assist function that includes floating the internal voltage line during a write operation on the bit cell, the internal voltage line being floated in response to a signal of a mode control signal group,
the mode control signal group includes a write assist signal, a sleep mode signal, and a power down signal, and
the power supply control circuit includes:
a NAND gate configured to receive the sleep mode signal and the write assist signal;
a first PMOS transistor including a source connected the power supply voltage, a drain connected to the internal voltage line, and a gate configured to receive an output signal from the NAND gate;
a second PMOS transistor including a source connected to the power supply voltage, and a gate configured to receive the power down signal; and
a third PMOS transistor including a source connected to a drain of the second PMOS transistor, a gate connected to the internal voltage line, and a drain connected to the internal voltage line.

7. A static memory device as claimed in claim 6, wherein:
the power supply control circuit is configured to float the internal voltage line at the bit cell when the power down signal corresponds to a logic state "low", the sleep mode signal corresponds to a logic state "high", and the write assist signal corresponds to a logic state "low" during the write operation, and the floated internal voltage has a voltage level between a first voltage level corresponding to the power supply voltage and a second voltage level that is less than the power supply voltage by an amount equal to a threshold voltage level of the third PMOS transistor.

8. The static memory device as claimed in claim 6, wherein the bit cell operates in a power down mode when the power down signal corresponds to a logic state "high" and the sleep mode signal corresponds to the logic state "high".

9. A static memory device, comprising:
a bit cell connected to an internal voltage line; and
a power supply control circuit connected between the internal voltage line and a power supply voltage, wherein:
the power supply control circuit is configured to supply a power supply voltage level to the internal voltage line,
the power supply control circuit is configured to perform a write assist function that includes floating the internal voltage line during a write operation on the bit cell, the internal voltage line being floated in response to a signal of a mode control signal group,
the mode control signal group includes a write assist signal and a power down signal, and
the power supply control circuit includes:
 a PMOS transistor including a source connected to the power supply voltage, a drain connected to the internal voltage line, and a gate configured to receive the write assist signal; and
 an n-type metal oxide semiconductor (NMOS) transistor including a drain connected to the power supply voltage, a gate configured to receive the power down signal, and a source connected to the internal voltage line.

10. The static memory device as claimed in claim 9, wherein:
the power supply control circuit is configured to float the internal voltage line at the bit cell when the power down signal corresponds to a logic state "high" and the write assist signal corresponds to the logic state "high" during the write operation, and the floated internal voltage line has a voltage level between a first voltage level corresponding to the power supply voltage and a second voltage level that is less than the power supply voltage by an amount equal to a threshold voltage level of the NMOS transistor.

11. A static memory device, comprising:
a bit cell connected to an internal voltage line; and
a power supply control circuit connected between the internal voltage line and a power supply voltage, wherein:
the power supply control circuit is configured to supply a power supply voltage level to the internal voltage line,
the power supply control circuit is configured to perform a write assist function that includes floating the internal voltage line during a write operation on the bit cell, the internal voltage line being floated in response to a signal of a mode control signal group,
the mode control signal group includes a write assist signal, a sleep mode signal, and a power down signal, and
the power supply control circuit includes:
 a NAND gate configured to receive the sleep mode signal and the write assist signal;
 a PMOS transistor including a source connected to the power supply voltage, a drain connected to the internal voltage line, and a gate configured to receive an output signal from the NAND gate; and
 an NMOS transistor including a drain connected to the power supply voltage, a gate configured to receive the power down signal, and a source connected to the internal voltage line.

12. The static memory device as claimed in claim 11, wherein:
the power supply control circuit is configured to float the internal voltage line at the bit cell when the power down signal corresponds to a logic state "high", the sleep mode signal corresponds to the logic state "high", and the write assist signal corresponds to the logic state "low" during the write operation, and the voltage on the floated internal voltage line has a voltage level between a first voltage level corresponding to the power supply voltage and a second voltage level that is less than the power supply voltage by an amount equal to a threshold voltage level of the NMOS transistor.

* * * * *